United States Patent [19]

Panayappan et al.

[11] Patent Number: 5,364,574
[45] Date of Patent: Nov. 15, 1994

[54] METHOD OF FORMING A CORROSION-RESISTANT EMI SHIELDING GASKET BETWEEN GRAPHITE AND METAL COMPONENTS

[75] Inventors: Ramanathan Panayappan, North Potomac, Md.; John C. Cooper, deceased, late of Burke, Va., by Linda Cooper, legal representative

[73] Assignee: The United States of America as represented by the Secretary of the Navy, Washington, D.C.

[21] Appl. No.: 864,812

[22] Filed: Apr. 2, 1992

[51] Int. Cl.⁵ ..................... H01Q 17/00; F16J 15/14
[52] U.S. Cl. ..................... 264/46.5; 156/79; 264/46.6; 277/1; 342/2
[58] Field of Search ............. 156/79, 78, 91, 92, 156/152; 264/46.5, 46.6, 45.3; 244/131, 132, 133; 342/2, 1; 277/1, 227

[56] References Cited

U.S. PATENT DOCUMENTS

| | | | |
|---|---|---|---|
| 3,116,198 | 12/1963 | Grawey | 156/91 |
| 3,318,569 | 5/1967 | Manor | 264/46.6 |
| 3,332,867 | 7/1967 | Miller et al. | 56/11 |
| 4,481,309 | 11/1984 | Straehle | 521/172 |
| 4,662,967 | 5/1987 | Bogan et al. | 156/242 |
| 4,785,148 | 11/1988 | Mayer | 252/62.51 |
| 4,791,236 | 12/1988 | Klein et al. | 174/36 |
| 4,823,229 | 4/1989 | Waterland, III | 361/218 |
| 4,857,668 | 8/1989 | Buonanno | 174/35 |
| 4,931,479 | 6/1990 | Morgan | 252/514 |
| 5,061,566 | 10/1991 | Morgan | 428/423.1 |
| 5,082,870 | 1/1992 | Fukuda | 521/76 |
| 5,116,558 | 5/1992 | Wrobel | 264/46.6 |

Primary Examiner—Michael W. Ball
Assistant Examiner—Daniel J. Stemmer
Attorney, Agent, or Firm—Thomas E. McDonnell; Barry A. Edelberg

[57] ABSTRACT

A composition is disclosed for forming an EMI shielding gasket for installation against a metal object, such as an aluminum frame member of an aircraft, wherein the composition is comprised of a mixture of a prepolymer composition of a flexible polyurethane material, a sacrificial metallic material which provides electrical conductivity and anodic protection against corrosion of the metal object, and a curing agent for curing the prepolymer composition. The sacrificial metallic material can be a metal salt selected from the group consisting of water soluble zinc and cadmium salts. Water can also be present to serve two functions, as a curing agent for the polyurethane and as a foaming agent, producing carbon dioxide. A method is also providing for installing an EMI shielding gasket on an aircraft between a graphite skin panel and a metal frame member. The composition for forming the EMI shielding gasket on a metal surface can also include an agent that cleans the metal surface to which the gasket is applied.

3 Claims, 1 Drawing Sheet

METHOD OF FORMING A CORROSION-RESISTANT EMI SHIELDING GASKET BETWEEN GRAPHITE AND METAL COMPONENTS

BACKGROUND OF THE INVENTION

The present invention described herein relates to the field of gaskets. More specifically, the invention relates to gaskets used to provide shielding from electromagnetic wave interference (EMI) and used to provide hermetic sealing. The invention especially relates to a gasket material used between graphite skin panels and aluminum structural components used in aircraft.

Gaskets to shield from EMI which are installed between graphite skin panels and aluminum frame components in aircraft are known. More specifically, such known gaskets are bonded to the aluminum frame components by using room temperature fluorosilicon compounds containing acetic acid.

Several problems arise from using the known EMI-shielding gaskets and the acetic-acid-containing bonding agent. First, severe corrosion, including pitting and exfoliation, of the aluminum frame components can take place, due primarily to the presence of the acetic acid. Second, since the bonding agent is nonconductive, electrical continuity is not provided between the graphite skin panels and the aluminum frame. This lack of electrical continuity permits charge separation and build up of electromotive force whereby corrosion due to differences in oxidation-reduction potential between the separated materials is accelerated. And, third, the hermetic sealing provided is somewhat limited.

In view of the above-described problems with the known EMI-shielding gaskets and the bonding agents used therewith between graphite skin panels and aluminum frame structures, it would be desirable to provide an EMI-shielding gasket that inhibits corrosion of the aluminum frame components, that provides electrical continuity between the graphite panels and the aluminum frame components thus affording EMI protection, and that provides an effective hermetic seal.

An important aspect of a suitable EMI shielding gasket is that exhibits a sufficient amount of resiliency to enable it to be compressed and expand as the parts between which it is installed move toward each other or move away from each other slightly.

With aircraft equipped with EMI shielding, at times degradation of the EMI shielding is observed. In such a case, the aircraft has to be partially disassembled to clean off residual gaskets from gasketted joints, and then new gaskets must be reinstalled. And as stated hereinabove, the new gaskets contain corrosion inducing agents such as acetic acid. Moreover, the process of disassembly, cleaning, installation of a new gasket, and reassembly is very time consuming and runs on the order of three days with certain aircraft. It would be desirable, therefore, to provide a more efficient way to repair EMI shielding gaskets whose EMI resistance has degraded in aircraft equipped with EMI shielding gaskets.

SUMMARY OF THE INVENTION

Accordingly, it is an object of the present invention to provide an EMI-shielding gasket placed between materials having dissimilar oxidation-reduction potentials that suppresses corrosion of the dissimilar materials.

Another object of the invention is to provide an EMI-shielding gasket that provides electrical continuity between materials having dissimilar oxidation-reduction potentials that suppresses corrosion of the dissimilar materials.

Still another object of the invention is to provide an EMI-shielding gasket material provides an effective hermetic seal between the dissimilar materials.

Another object of the invention is to provide an EMI shielding gasket that has sufficient resiliency to enable it to be compressed and expand as the parts between which it is installed move toward each other or move away from each other slightly, thereby providing an effective hermetic seal.

Yet another object of the invention is to provide an EMI-shielding gasket material placed between graphite panels and aluminum frame components of an aircraft that suppresses corrosion of the aluminum frame components, that provides electrical continuity between the graphite panels and the aluminum frame components, and that provides an effective hermetic seal between the graphite panels and the aluminum frame components.

Still another object of the invention is to provide a an efficient way to repair EMI shielding gaskets whose EMI resistance has degraded in aircraft equipped with EMI shielding gaskets.

Briefly, these and other objects are accomplished by employing a composition for forming an EMI shielding gasket for installation against a metal object, such as an aluminum frame member of an aircraft, wherein the composition is comprised of a mixture of a prepolymer composition of a flexible polymeric material, a sacrificial metallic material which provides electrical conductivity and anodic protection against corrosion of the metal object, and a curing agent for curing the prepolymer composition. The sacrificial metallic material can be either a metallic salt or a metal powder.

In a preferred class of prepolymer compositions, the prepolymer composition is for providing a polyurethane, the sacrificial metallic material is a metal salt is selected from the group consisting of water soluble zinc and cadmium salts, and the balance is water. The water serves to cure the prepolymer composition and to cause a release of carbon dioxide gas which causes the polyurethane to be foamed. The foamed polyurethane provides added resiliency to the EMI shielding gasket formed in accordance with the invention thereby enhancing the ability of the EMI shielding gasket to form a hermetic seal.

The compositions of the invention are especially useful for forming an EMI shielding gasket for installation between a graphite skin panel and an aluminum frame component of an aircraft.

In accordance with another aspect of the invention, a method is provided for installing an EMI shielding gasket between a graphite skin panel and a metallic frame component in an aircraft. The method includes the following steps. First, means, such as bolts, for connecting the graphite skin panel and the metallic frame component are loosened. Then, the graphite skin panel and the metallic frame component are separated to provide a space therebetween. Next, a liquid composition capable of polymerizing to form a gasket is introduced into the space between the graphite skin panel and the metal frame component. Then, the liquid composition is permitted to at least partially polymerize whereby a gasket is formed between the graphite skin panel the metallic frame component. Then, if desired, the bolts can be retightened to secure the graphite skin panel to the metallic frame component with an EMI shielding gasket sandwiched therebetween.

In accordance with still another aspect of the invention, a composition is provided for forming a gasket on a metal surface. The composition includes, in combination, a prepolymer composition of a flexible polymeric material, a metal surface cleaning agent, and a curing agent for curing the polymeric material. More specifically, it has been discovered that the metal surface cleaning agent and the curing agent for the polymer can be embodied in a single combined metal surface cleaning and polymer curing agent. Even more specifically, for a prepolymer composition for forming a flexible polyurethane gasket, the combined metal surface cleaning agent and polymer curing agent can be dimethylene glycol-di-p-aminobenzoate.

Other objects, advantages and novel features of the invention will become apparent from the following detailed description of the invention when considered in conjunction with the accompanying drawings herein.

DESCRIPTION OF THE PREFERRED EMBODIMENT(S)

Figure 1:
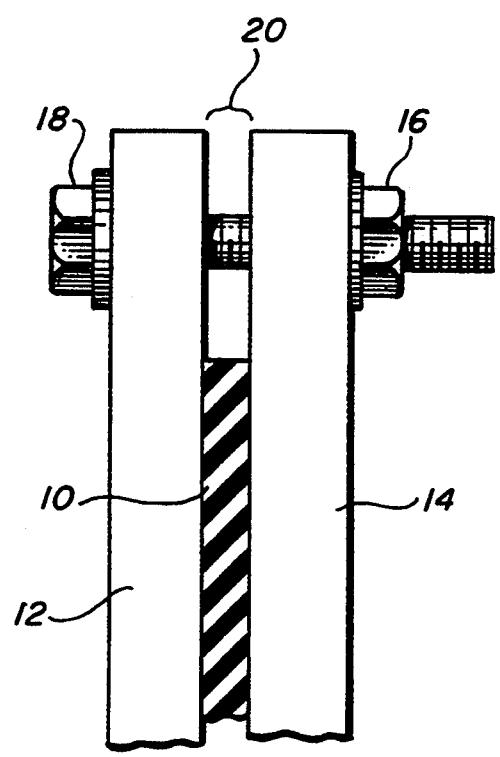
FIG. 1 shows an EMI shielding gasket of the invention sandwiched between a graphite skin panel and an aluminum frame member of an aircraft.

With reference to FIG. 1, an EMI shielding gasket 10 is installed between a graphite skin panel 12 and a metallic frame component 14 in an aircraft (not shown). The graphite skin panel 12 and the metallic frame component 14 are connected together with nut 16 and bolt 18.

In carrying out the method of the invention of installing an EMI shielding gasket 10 between a graphite skin panel 12 and a metallic frame component 14 which are connected together, first the nut 16 and bolt 18 is loosened. Then, the graphite skin panel 12 and the metallic frame component 14 are separated to provide a space 20 therebetween. Next, a liquid composition capable of polymerizing to form an EMI shielding gasket 10 is introduced into the space. The liquid composition is permitted to at least partially polymerize whereby an EMI shielding gasket 10 is formed between the graphite skin panel 12 and the metallic frame component 14. The nut 16 and bolt 18 can then be retightened if desired.

More specifically, a liquid composition for forming the EMI shielding gasket 10 for installation between a graphite skin panel 12 and an aluminum frame member 14 can be comprised of a mixture of: a prepolymer composition of a polyurethane; a sacrificial conductive metal salt which provides EMI protection and anodic protection for the aluminum, and the balance being water which serves to cure and foam the polyurethane.

The following examples of compositions capable of forming an EMI shielding gasket are provided.

EXAMPLE 1

A mixture of 85.7 grams of Adiprene L-167 (a prepolymer of a polyurethane made by the Uniroyal Corporation), 4.8 grams of zinc chloride, and 9.5 grams of reagent grade water is blended. This mixture is suitable for forming a polyurethane-based EMI shielding gasket after approximately 4 hours of curing at room temperature and pressure between two metal plates. IMI reduction tests indicate this gasket material to be a good electrical bonding material that reduces IMI substantially (approximately 25 db). The EMI shielding gasket formed is flexible and can be easily peeled off of the metal plates.

EXAMPLE 2

A mixture of 8 grams Adiprene L-167, 4 grams of zinc carbonate, 2 grams of Polacure (a curing agent made by Polaroid Corporation which is dimethylene glycol-di-p-aminobenzoate), and 4 grams of water. This mixture is a smooth paste and cures to a polyurethane-based EMI shielding gasket in approximately 4 hours at room temperature and pressure.

The chemical formula for dimethylene glycol-di-p-aminobenzoate is as follows:

$$H_2N—\Phi—C—O—(CH_2)_3—O—C—\Phi—NH_2$$

A test was conducted on the gasket formed in Example 2. The mixture of Example 2 was applied between aluminum flanges and let cure for 4 hours forming an EMI shielding gasket of the invention. The DC resistance was then measured. The measured resistance was 0.95 ohms, and this value did not change after 15 days. The polyurethane-based gasket formed from Example 2 was flexible and was easily peeled off from the aluminum surfaces. Examination of the aluminum flange surfaces under a high power microscope showed no evidence of corrosion.

To further test the effectiveness of the EMI shielding gaskets prepared in Examples 1 and 2 above, a portion of each pre-gasket mixture was applied to aluminum test flanges, simulating the airframe of an aircraft. The gaskets were cured, and then they were fog salt-spray tested. DC resistances were measured over a period of 15 days, and the resistances were observed to be substantially constant over the test period.

After the salt spray tests, the aluminum flanges were examined under a high resolution microscope for corrosion. The composition containing zinc chloride (Example 1) showed a degree of corrosion. However, the composition containing zinc carbonate (Example 2) did not show corrosion.

Although the phenomena occurring with the EMI shielding gasket of the invention are not fully understood, a theoretical explanation is provided herein in order to lend greater understanding as to the operation of the invention.

With the mixture described in Example 1, the EMI shielding gasket formed provides protection from EMI interference and anodic protection due to the presence of the zinc chloride. The presence of water serves as a combined curing and foaming agent.

With the mixture described in Example 2, in addition to protection from EMI interference and anodic protection provided by the zinc carbonate, and in addition to partial curing and foaming characteristics provided by the water, the metal surface (aluminum) is cleaned with respect to metal oxide on the metal surface. The agent for cleaning the metal oxide from the surface of the metal is theorized to be the curing agent, the Polacure, which also partially cures the polyurethane. The Polacure accomplishes the surface cleaning function and in addition serves as a metal ion complexing agent to complex both metal ions on the surface of the metal and metal ions from the metal salts included to provide EMI protection and anodic protection.

It is contemplated that to obtain an EMI shielding gasket having a lower resistance than the gasket formed from the composition of Example 2, the zinc carbonate can be replaced with silver nitrate with the addition of erythorbic acid to the remainder of the ingredients of Example 2.

In addition to the ingredients and proportions set forth in the above examples, a wide variety of variations can be employed in accordance with the principles of the invention. More specifically, the sacrificial metal salt is can be selected from the group consisting of water soluble zinc and cadmium salts (e.g. cadmium nitrate).

The sacrificial material can also be a metal powder.

With respect to the ingredients disclosed in Example 1 above, variation of the proportions of ingredients are contemplated. The prepolymer composition of the polyurethane can be present in a range of from 75–92% by weight. The conductive sacrificial zinc chloride can be present in a range from 2 to 10% by weight; and the water can be present in a range from 6 to 15% by weight.

With respect to the ingredients set forth in Example 2 above, erythorbic acid can also be added as an ingredient to clean the surface of the metal of metal oxides.

In addition to the polyurethane curing agents disclosed above, other conventional curing agents can be used such as methylene-ei-aniline (MDA).

Numerous benefits are obtained by following the principles of the invention. With the invention, a new, rapid forming EMI shielding gasket is provided for use on aircraft wherein removable skin panels are to be electrically bonded to the aircraft frame to provide for EMI protection in the interior of the aircraft. EMI shielding gaskets made in accordance with the invention provide efficient hermetic sealing (due especially to the resilience provided by the foam formed because of the presence of water in the prepolymer composition), clean the metal surfaces to which they are applied of metal oxides (e.g. due to dimethylene glycol-di-p-aminobenzoate), suppress corrosion of the metal surfaces (due to anodic protection and absence of acetic acid), are easily peeled off of the metal surfaces for removal therefrom, have a low dielectric constant (due to the polyurethane and carbon dioxide forming the polyurethane foam which low dielectric constants), and has low resistance (due to the metallic materials present, either metal salts or metal powders, which provide the electrical bonding between the removable skin panel and the metal frame structures).

It will be understood that various changes in the details, steps and arrangement of parts which have been herein described and illustrated to explain the nature of the invention, may be made by those skilled in the art within the principles and scope of the invention as expressed in the appended claims.

What is claimed is:

1. A method of installing a removable EMI shielding gasket between a graphite skin panel and a metallic frame component in an aircraft, comprising the steps of:
   loosening means for connecting the graphite skin panel and the metallic frame component;
   separating the graphite skin panel and the metallic frame component to provide a space therebetween;
   introducing into said space a liquid composition capable of polymerizing to form a gasket, said liquid composition comprising:
   a prepolymer composition of a polyurethane present in a range of from 75–92% by weight,
   from 2 to 10% by weight of zinc chloride, and
   from 6 to 15% by weight of water;
   permitting the composition to at least partially polymerize whereby a gasket is formed between the graphite skin panel the metallic frame component, said gasket being removable from said metallic frame component by peeling.

2. The method described in claim 1 comprising the additional step of tightening the means for connecting the graphite skin panel and the metallic frame component.

3. The method described in claim 1 wherein the metallic frame component is made from aluminum.

* * * * *